(12) United States Patent
Visconti

(10) Patent No.: US 7,478,292 B2
(45) Date of Patent: Jan. 13, 2009

(54) STRUCTURE AND METHOD FOR DETECTING ERRORS IN A MULTILEVEL MEMORY DEVICE WITH IMPROVED PROGRAMMING GRANULARITY

(76) Inventor: Angelo Visconti, Via Colombo, 27, I-22070 Appiano Gentile (CO) (IT)

( * ) Notice: Subject to any disclaimer, the term of this patent is extended or adjusted under 35 U.S.C. 154(b) by 374 days.

(21) Appl. No.: 10/741,815

(22) Filed: Dec. 18, 2003

(65) Prior Publication Data

US 2004/0177292 A1    Sep. 9, 2004

(30) Foreign Application Priority Data

Dec. 18, 2002    (IT)    ............... MI2002A2669

(51) Int. Cl.
*G06F 29/00*    (2006.01)
(52) U.S. Cl. .................................................. 714/721
(58) Field of Classification Search ................. 714/721; 365/185.03
See application file for complete search history.

(56) References Cited

U.S. PATENT DOCUMENTS 5,754,566 A    5/1998    Christopherson et al.    371/40.18
6,785,860 B1 *    8/2004    Patti ........................... 714/764
7,096,406 B2 *    8/2006    Kanazawa et al. ........... 714/763

FOREIGN PATENT DOCUMENTS

| EP | 094075 A1 | 8/1999 |
| EP | 1028379 | 8/2000 |
| EP | 1035473 | 9/2000 |

OTHER PUBLICATIONS

European Search Report, EP03104709, Jun. 4, 2004.

\* cited by examiner

*Primary Examiner*—James C Kerveros
(74) *Attorney, Agent, or Firm*—Blakely, Sokoloff, Taylor & Zafman LLP

(57) ABSTRACT

An error detection structure is proposed for a multilevel memory device including a plurality of memory cells each one being programmable at more than two levels ordered in a sequence. Each level representsmg a logic value consisting of a plurality of bits, wherein the structure includes components for detecting errors in the values of a selected block of memory cells. The structure further includes components for partitioning the bits of each memory cell of the block into a first subset and a second subset, the bits of the first subset being unchanged in the values of a first and a second ending range in the sequence. The components_for detecting errors only operate on the bits of the second subset of the block.

9 Claims, 4 Drawing Sheets

STRUCTURE AND METHOD FOR DETECTING ERRORS IN A MULTILEVEL MEMORY DEVICE WITH IMPROVED PROGRAMMING GRANULARITY

PRIORITY CLAIM

This application claims priority from Italian patent application No. MI2002A002669, filed Dec. 18, 2002, which is incorporated herein by reference.

TECHNICAL FIELD

The present invention relates to an error correction structure and a corresponding method for a multilevel memory device.

BACKGROUND

Multilevel memory devices (such as, for example, flash E2PROMs) are commonly used in several applications. As it is known, in a multilevel memory device each cell can take a number of states higher than two (each state being associated with a corresponding logic value).

This results in a high density of the multilevel memory device, with a consequent low cost per units of stored information. Nevertheless, this result is achieved maintaining good performance of the memory device; particularly, the multilevel memory devices provide high information transfer speeds in burst mode. Consequently, the multilevel memory devices are well suited to a number of end-product applications, such as solid state mass memories, cellular telephones, digital still cameras, multimedia devices, and the like.

A still open question relating to the multilevel memory devices is their reliability. In fact, the multilevel memory devices are considered more sensitive to data retention problems and to noise than equivalent traditional memory devices (at two levels). Consequently, many producers equip the multilevel memory devices with error detection structures.

For this purposes, Error Correction Codes, or ECC, are commonly used. The error correction codes add redundant control information to each predefined set of logic values (for example, consisting of a page formed by four words each one of 16 bits). This control information is used for detecting and correcting (if possible) any errors in the page. This allows tolerating a drift of the cells in the multilevel memory device without impairing its operation.

Nevertheless, the error detection structures known in the art involve a considerable waste of space for storing the control information associated with the various pages. Furthermore, the logic networks commonly used for calculating the control information require a high number of levels; such levels introduce corresponding propagation delays of the signals, thereby slowing down the operation of the whole multilevel memory device.

Furthermore, the error detection structures impose some constraints to the operation of the multilevel memory device. Particularly, once a page with the respective control information has been written onto the multilevel memory device, it is generally impossible to modify its content any longer (without a complete erasing and re-writing of the updated page with the new control information). In the same way, this requires the reading of a whole page (for verifying its correctness), before the content thereof can be used. In other words, the size of the page defines the granularity of the multilevel memory device.

However, several applications need to process information at the word level or even at the bit level. For example, this can happen when the multilevel memory devices are used in the place of pre-existing standard memory devices. Such requirements cannot be satisfied by the error detection structures known in the art. In fact, this would require an amount of control information that is absolutely unacceptable, thereby making vain the advantages provided by the use of the multilevel memory devices.

SUMMARY

An aspect of the present invention is to overcome the above-mentioned drawbacks through a structure as set out in the first claim.

Briefly, one aspect the present invention provides an error detection structure for a multilevel memory device including a plurality of memory cells each one being programmable at more than two levels ordered in a sequence, each level representing a logic value consisting of a plurality of bits, wherein the structure includes means for detecting errors in the values of a selected block of memory cells; the structure further includes means for partitioning the bits of each memory cell of the block into a first subset and a second subset, the bits of the first subset being unchanged in the values of a first and a second ending range in the sequence, the means for detecting errors only operating on the bits of the second subset of the block.

Furthermore, aspects of the present invention provide a multilevel memory device including this structure and a corresponding error detection method for a multilevel memory device is also encompassed.

BRIEF DESCRIPTION OF THE DRAWINGS

Further features and the advantages of the solution according to aspects of the present invention will be made clear by the following description of a preferred embodiment thereof, given purely by way of a non-restrictive indication, with reference to the attached figures, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
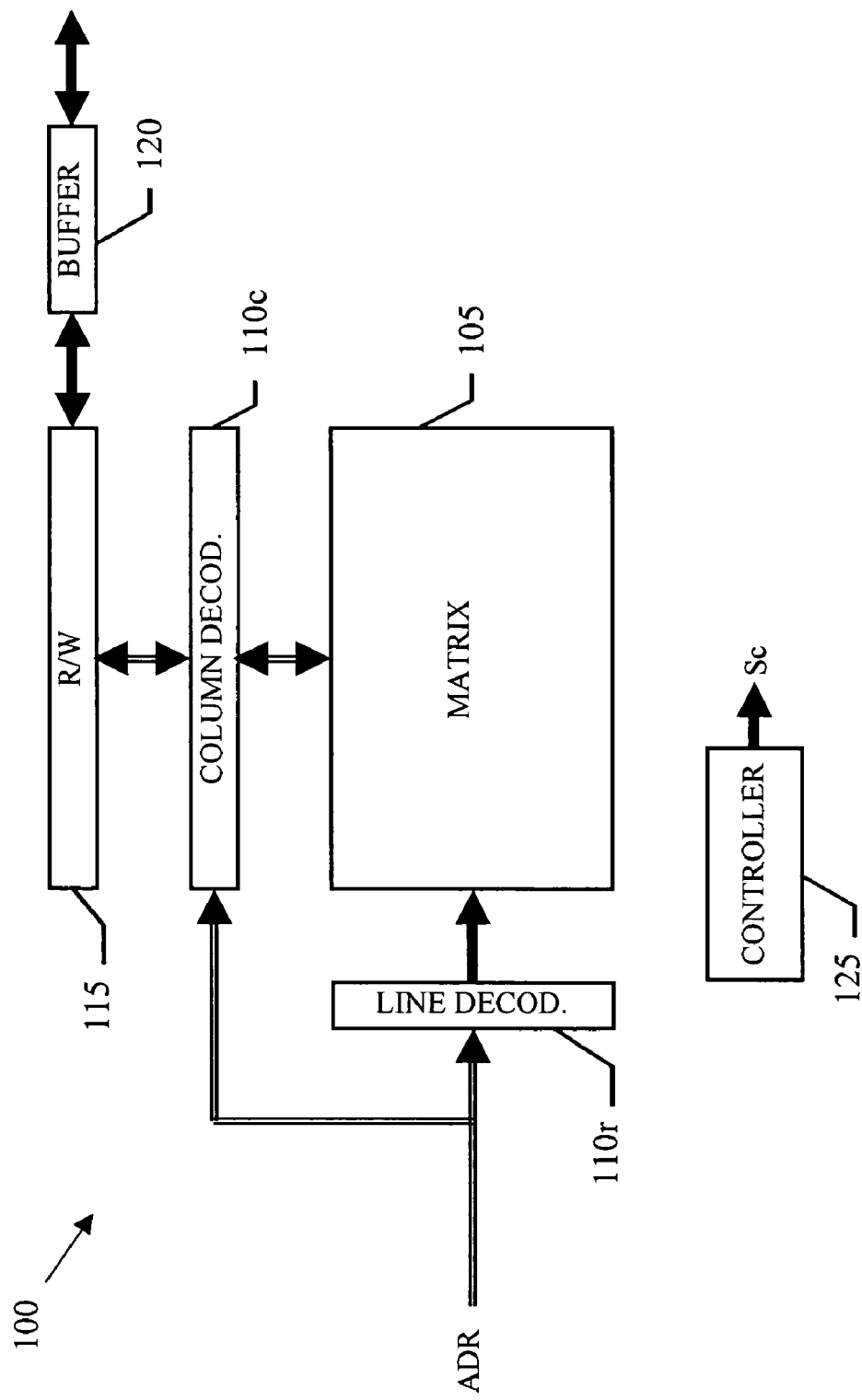
FIG. 1 is a schematic block diagram of a multilevel memory device in which the structure of the invention can be used according to one embodiment of the present invention.

With reference in particular to FIG. 1, a non-volatile memory device 100, for example, consisting of a flash E2PROM, is illustrated. The flash memory 100 is integrated on a chip of semiconductor material, and includes a matrix 105 of memory cells (for example, having a so-called NOR architecture).

Each memory cell consists of a floating gate MOS transistor. The memory cell in a non-programmed (or erased) condition exhibits a low threshold voltage. The memory cell is programmed by injecting electric charge into its floating gate; the memory cell can be programmed at multiple levels, each one associated with a corresponding range of its threshold voltage. Each level represents a different logic value; for example, the flash memory 100 supports 4 levels, so that each memory cell stores a logic value consisting of 2 bits of information (11, 10, 01 and 00 for increasing threshold voltages). As described in detail in the following, the flash memory 100 uses an error correction code, in which control information is associated with the information actually stored in the memory cells.

A line or row decoder 110$r$ is used for selecting one row of the matrix 105; similarly, a column decoder 110$c$ is used for selecting one or more columns of the matrix 105. The memory cells of the matrix 105 are selected (by the decoders 110$r$ and 11$c$) in response to an address ADR. The information stored in the matrix 105 is logically organized into words, each one consisting of 16 bits; the words are in turn grouped into pages of 4 consecutive words.

A unit (R/W) 115 is used for reading and writing the memory cells selected by the decoders 110$r$ and 110$c$. The above-described structure allows selecting (in reading and/or programming mode) the memory cells associated with a page, a word or a single bit. The values to be written into the matrix 105 or to be read from the matrix 105 are latched into an input/output buffer 120. Particularly, this allows executing a reading in burst mode, in which a sequence of bits is provided in succession (from the input/output buffer 120) at each clock signal.

A control logic 125 (for example, consisting of a state machine) manages the operation of the flash memory 100. For this purpose, the control logic 125 outputs a sequence of control signals (denoted as a whole with Sc).

However, the concepts of the described embodiment of the present invention are also applicable when the flash memory has a different architecture, when the memory cells are implemented by equivalent devices, or when the memory cells are programmable at another number of levels (also different from a power of 2). Similar considerations apply if each page and/or word has a different size, if another memory device is used (for example, an EPROM), and the like.

Figure 2:
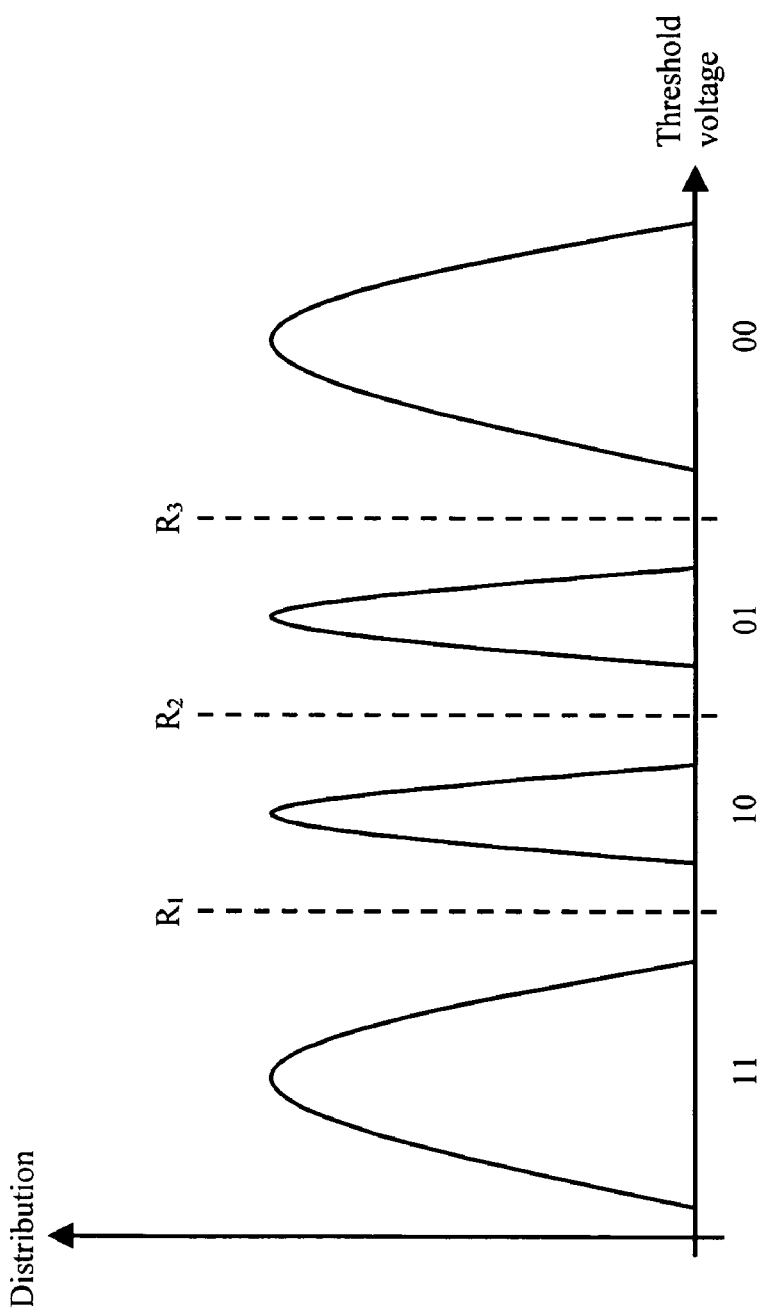
FIG. 2 illustrates the distribution of the threshold voltage in a memory cell according to one embodiment of the present invention.

In a generic memory cell, as shown in FIG. 2, each couple of adjacent logic values is discriminated by a corresponding reference voltage Rj (with j=1, ..., 3 in the case at issue); for example, the memory cell is considered at the level 10 when its threshold voltage is included between the reference voltage R1 and the reference voltage R2.

The error correction code allows detecting and automatically correcting each error of a single bit in any position of a predetermined block of information. Such an error is caused by the drift of one of the memory cells used for storing the block of information. In this situation, the threshold voltage of the memory cell shifts from a correct level to a level adjacent thereto; particularly, if the floating gate of the memory cell has lost its electric charge, the threshold voltage will decrease (with a consequent increase of a bit of the stored logic value), while if the memory cell has incremented its electric charge the threshold voltage will increase (with a consequent decrease of a bit of the stored logic value). In order to detect and correct such an error in a block of information consisting of m bits, it is necessary to provide a block of control information consisting of k bits, where:

$$k \geq \log_2 m + 1$$

In the error detection structures known in the art, the control information is calculated on a whole page of 64 bits (stored in 64/2=32 memory cells); this requires log$_2$64+1=6+1=7 control bits, i.e., 7/2=4 additional memory cells. Therefore, the increase of memory cells caused by the use of the, error correction code is equal to 12.5% (4/32). In this case, however, the granularity of the flash memory is at the page level.

Instead, the processing of information at the level of a word of 16 bits (stored in 16/2=8 memory cells) would require log$_2$16+1=4+1=5 control bits for each word, i.e., 5/2=3 additional memory cells (with an increase of 3/8 memory cells, equal to 37.5%). The processing of information at the bit level would even require log$_2$1+1=0+1=1 control bits for each bit of information, with an increase of memory cells equal to 100%.

The inventors have discovered that the error detection structures known in the art are not optimal. In fact, a thoughtful analysis has revealed that the difference of reliability between a multilevel flash memory and a corresponding standard flash memory (at two-levels) is mainly due to errors corresponding to the ending levels supported by the memory cells; those errors occur when the threshold voltage of the memory cell crosses the reference voltage R1 (passing from the logic value 11 to the logic value 10, or vice-versa) and when the threshold voltage of the memory cell crosses the reference voltage R3 (passing from the logic value 00 to the logic value 01, or vice-versa). On the contrary, in a multilevel flash memory the percentages of errors caused by a loss of charge at the level 01 or by an increase of charge at the level 10 are equal (if not even lower) than those of a standard flash memory.

Consequently, by limiting the detection and the correction of the errors to the transitions between the values 11-10 and the transitions between the values 00-01, it is possible to ensure a level of reliability at least equal to that of a standard flash memory. In this respect, it should be noted that in both cases the most significant bit of the logic value stored in the memory cell is unchanged. The error detection structure can then act on the least significant bit only of the logic value stored in each memory cell. Therefore, the control information is calculated on a halved number of bits, thereby reducing its memory occupation. For example, the control information for a page of 64 bits consists of log$_2$32+1=5+1=6 bits; this requires 6/2=3 additional memory cells (with an increase of 3/32 memory cells, equal to 9.375%).

However, the concepts of the present invention are also applicable when the error correction code is able to correct a different number of errors, when another control code is used (for example, only able to detect the errors but not to correct them), and the like.

Considering now FIG. 3$a$, a writing section of the R/W unit 115 is illustrated. The unit 115 receives a page PG of 64 bits to be written on selected memory cells of the matrix. The page PG is formed by 4 words Wa, Wb, Wc and Wd, each one consisting of 16 bits (a0-a15, b0-b15, c0-c15 and d0-d15, respectively).

The words Wa and Wc are provided to an encoder 305$ac$; the encoder 305$ac$ combines the words Wa and Wc in a sequence Wac of 32 bits, in which the odd positions are taken by the bits c0-c15 of the word Wc and the even positions are taken by the bits a0-a15 of the word Wa (c0a0 ... c15a15). In a similar way, the words Wb and Wd are provided to an encoder 305*bd*, which combines the words Wb and Wd in a sequence Wbd of 32 bits; particularly, the odd positions are taken by the bits d0-d15 of the word Wd and the even positions are taken by the bits b0-b15 of the word Wb (d0b0 . . . d15b15).

A binary-multilevel converter (B2ML) 310*ac* translates the sequence of 32 bits Wac into a corresponding sequence of 16 values MWac, each one representing the level of a corresponding memory cell. Likewise, a further binary-multilevel converter 310*bd* translates the sequence of 32 bits Wbd into a corresponding sequence of 16 values MWbd for corresponding memory cells. Particularly, the converters 310*ac*,310*bd* associate the level representing the logic value defined by each couple of adjacent bits of the sequences Wac,Wbd with this couple of bits. Consequently, the words Wc,Wd will be represented by the least significant bits of the logic values corresponding to the sequences MWac,MWbd (while the words Wa,Wb will be represented by the most significant bits thereof). This distribution scheme for the bits of the words Wa-Wd is already known in the art; it has been proposed for increasing the speed of a reading operation in burst mode, wherein the most significant bits are available before the least significant bits stored in each memory cell.

Meanwhile, the word Wc is provided to an ECC decoder 315*c*; the ECC decoder 315*c* calculates a correction vector Pc (consisting of 5 bits) for the word Wc. Likewise, the word Wd is provided to an ECC decoder 315*d*, which calculates a further correction vector Pd (of 5 bits) for the word Wd. A binary-multilevel converter 320 translates the complex of the correction vectors Pc and Pd (10 bits) into a corresponding sequence of 5 values MPcd for corresponding memory cells. The converter 320 is further input two enabling signals ENc and End, which are translated into a value MENcd for a corresponding memory cell.

A bank of program loads 325 receives the sequences of values MWac,MWbd, the sequence of values MPcd, and the value MENcd. Each value is provided to a program load of the bank 325, which drives a corresponding selected memory cell so as to program it to the desired level. Therefore, the page PG will be stored into 32 memory cells (information cells), while the correction vectors Pc,Pd will be stored into 5 memory cells (control cells); a further memory cell will be used for storing the enabling signals ENc,ENd. Particularly, the least significant bits stored in 16 information cells will represent the word Wc, while the most significant bits stored in the same information cells will represent the word Wa; likewise, the least significant bits and the most significant bits stored in the others 16 information cells will represent the word Wd and the word Wb, respectively.

Figure 3A:
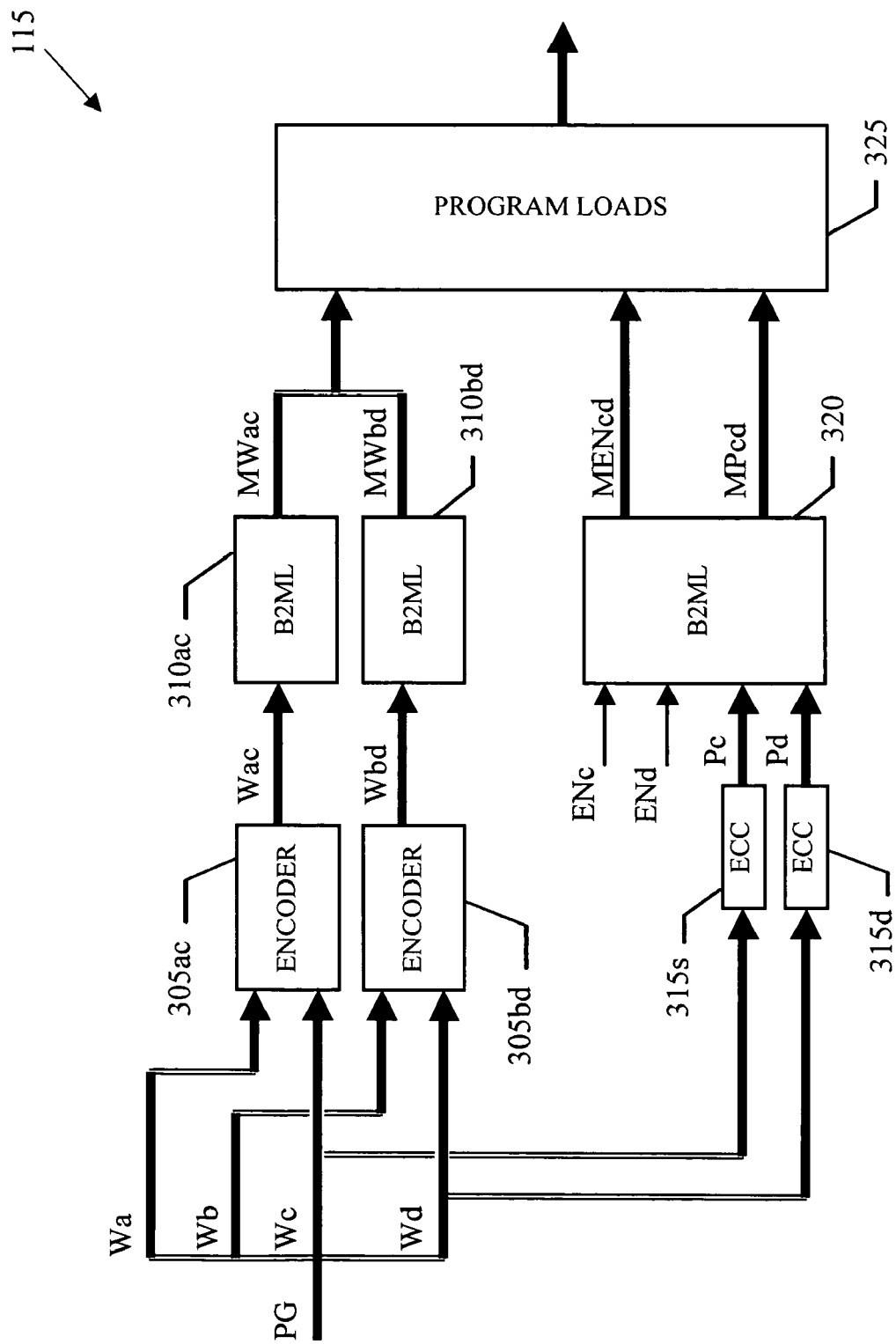
FIGS. 3a and 3b show a writing section and a reading section of the multilevel memory device, respectively, in a schematic way according to one embodiment of the present invention.
Figure 3B:
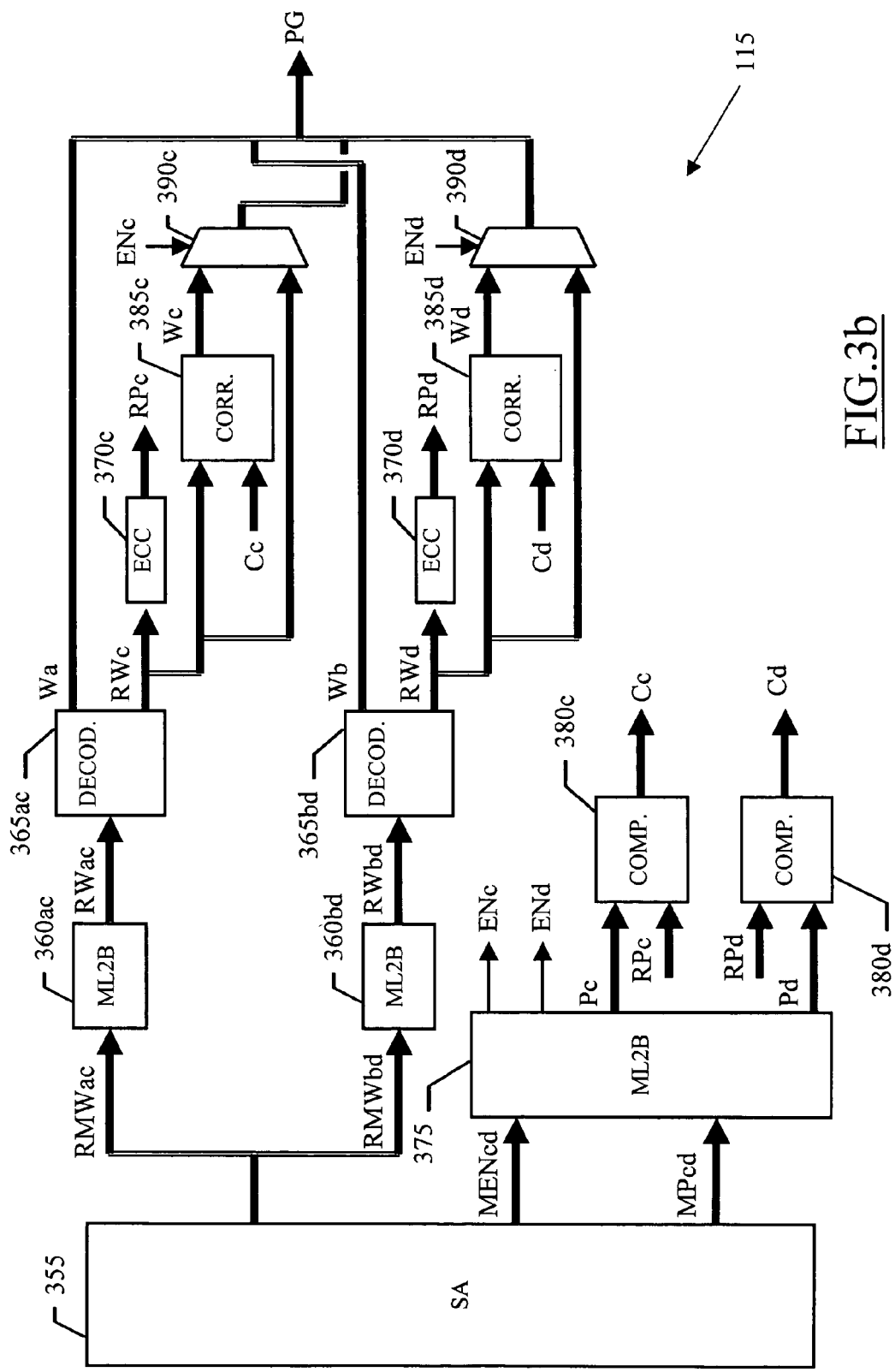

Passing now to FIG. 3*b*, a reading section of the unit 115 is illustrated. A bank of sense amplifiers (SA) 355 reads the values stored in selected cells of the matrix. Particularly, the bank of sense amplifiers 355 provides two sequences of 16 values RMWac and RMWbd (stored in 32 information cells), a sequence of 5 values MPcd (stored in 5 corresponding control cells), and a value MENcd.

A multilevel-binary converter (ML2B) 360*ac* translates the sequence of 16 values RMWac into a corresponding sequence of 32 bits RWac; likewise, a further binary-multilevel converter 360*bd* translates the sequence of 16 values RMWbd into a corresponding sequence of 32 bits RWbd.

The sequence of bits RWac is provided to a decoder 365*ac*; the decoder 365*ac* partitions the sequence of 32 bits RWac into two words Wa and RWc each one of 16 bits, by assigning the bits in odd positions to the word RWc and the bits in even positions to the word Wa. In a similar way, the sequence of 32 bits RWbd is provided to a decoder 365*bd*, which partitions it into two further words RWd and Wb each one of 16 bits (with the bits in odd positions that are assigned to the word RWd and the bits in even positions that are assigned to the word Wb). Consequently, the words RWc,RWds will consist of the least significant bits of the logic values corresponding to the sequences RMWac,RMWbd (while the words Wa,Wbs will consist of the most significant bits of the same sequences).

The word RWc is provided to an ECC decoder 370*c*; the ECC decoder 370*c* calculates a correction vector RPc (consisting of 5 bits) for the word RWc. Likewise, the word RWd is provided to an ECC decoder 370*d*, which calculates a further correction vector RPd (of 5 bits) for the word RWd. The ECC decoders 370*c*,370*d* are identical to the decoders ECC 315*c*, 315*d* used in the writing section of FIG. 3*a*.

Meanwhile, a binary-multilevel converter 375 translates the sequence of 5 values MPcd into a corresponding sequence of 10 bits, which is partitioned into two correction vectors Pc and Pd (each of 5 bits). At the same time, the converter 375 translates the value MENcd into two enabling signals ENc and ENd.

The correction vector RPc (calculated from the word RWc read from the information cells) and the correction vector Pc (stored in the control cells) are provided to respective inputs of a vector comparator 380*c*. The comparator 380*c* generates a control block Cc (of 5 bits); the control block Cc indicates the possible presence of errors in the corresponding word RWc, and in this case their position and correction. In a completely similar way, the correction vector RPd and the correction vector Pd are provided to respective inputs of a vector comparator 380*d*, which generates a corresponding control block Cd (of 5 bits).

A correction unit 385*c* is input the word RWc (read from the matrix) and the control block Cc; the unit 385*c* corrects the word RWc (if necessary). A word Wc so-obtained and the word RWc are provided to respective inputs of a multiplexer 390*c*, which is driven by the enabling signal ENc. Likewise, a further correction unit 385*d* is input the word RWd and the control block Cd. A word Wd (possibly corrected by the unit 385*d*) and the word RWd are provided to respective inputs of a multiplexer 390*d*, which is driven by the enabling signal ENd.

The words Wa and Wb (read from the matrix), the word transferred by the multiplexer 390*c* (consisting of the word RWc read from the matrix or of the corrected word Wc), and the word transferred by the multiplexer 390*d* (RWd or Wd) are grouped to form a page PG, which is output by the unit 115.

Considering now FIGS. 3*a* and 3*b* together, during a writing operation the selected memory cells are programmed in such a way to store the values corresponding to the page PG and the correction vectors Pc and Pd (for the words Wc and Wd). At the same time, the enabling signals ENc and ENd are asserted.

In this condition, the words Wa,Wb can be directly read from the matrix and, therefore, are immediately available (without any additional calculation). The words RWc,RWd (read from the matrix) are instead corrected, if it is necessary, and the corresponding words Wc,Wd are output by the multiplexers 390*c*,390*d*. In the case of a reading operation in burst mode, the bits of the words Wa and Wb can be output immediately; meanwhile, the words Wc,Wds are read and corrected, in such a way to be immediately available at the end of the words Wa,Wb as well; consequently, the reading operation in burst mode does not require any waiting time on the whole.

The above-described structure further allows programming each word Wa-Wd individually. Particularly, the words Wa,Wb can be modified without any additional calculation; the programming of the words Wc and Wd instead requires the calculation and the updating of the corresponding correction vectors Pc and Pd, respectively.

The words Wa,Wb can also be programmed at the bit level (thanks to the absence of any associated control information). Instead, if it was necessary to program one or more bits of the words Wc or Wd, the corresponding portion of the error detection structure would have to be disabled. Particularly, the control logic of the flash memory de-asserts the enabling signals ENc or ENd in response to each change of the words Wc or Wd, respectively. Therefore, when the corresponding memory cells are read, the multiplexers $390c,390d$ will output the words RWc,RWd read from the matrix (since the correction vectors Pc,Pds are no longer valid). It is evident that this involves the impossibility of correcting any errors in the words Wc,Wd. Nevertheless, considering that the operations of programming at the bit level are generally occasional and that the mean frequency of the errors is very low (of the order of $1/106$-$107$), it results that the reliability of the flash memory in every case remains acceptable.

The above-described structure allows the programmability at the word level, and partially also at the bit level, only requiring 5 additional memory cells for each page (stored in 32 memory cells); therefore, this involves an increase of 5/32 memory cells, equal to 15.625%. This percentage is far lower than the one required by the known error detection structures for obtaining the programmability at the bit level (100%) or even only at the word level (37.5%). It is further important to observe that such a result is reached without any reduction of reliability with respect to corresponding standard memory devices.

The complete programmability at the bit level instead requires 6 additional memory cells; this involves an increase of 6/32 memory cells, equal to 18.75%. Therefore, accepting a substantially negligible reduction of reliability, it is possible to obtain the desired result with a very limited increase of memory cells (in comparison to the 100% required by the known error detection structures).

However, it is opportune to point out that the above-described particular mode of distribution of the bits of the words Wa-Wd always requires a preventive reading operation of the memory cells involved in any programming operation (both at the word level and at the bit level). Indeed, it is necessary to know the logic value currently stored in each memory cell for establishing the level that the memory cells have to reach. For example, considering the memory cell associated with the bits c0a0, if the bit c0 has to be programmed (from 1 to 0), the memory cell will reach the level corresponding to the logic value 00 when a0=0 or the level corresponding to the logic value 01 when a0=1.

However, the described concepts of the present invention are also applicable when the writing section and/or the reading section have an equivalent structure, or when the words to be written are combined in another way. Similar considerations apply if a different correction algorithm is implemented, if equivalent means is provided for selectively disabling the error detection structure, and the like.

More generally, the described embodiment of the present invention proposes an error detection structure for a multilevel memory device. The memory device includes a plurality of memory cells. Each memory cell is programmable at more than two levels (ordered in a sequence); each level represents a logic value consisting of a plurality of bits. The structure includes means for detecting errors in the values of a selected block of memory cells. In the structure of the described embodiment of the present invention, means for partitioning the bits of each memory cell of the block into a first subset and a second subset are further provided; the bits of the first subset are unchanged in the values of a first and a second ending range in the sequence. Moreover, the means for detecting errors only operates on the bits of the second subset of the block.

The proposed solution greatly reduces the waste of space for storing the control information required by the error detection structure.

Furthermore, this allows reducing the number of levels of the logic networks commonly used for calculating the control information; consequently, the operation speed of the whole multilevel memory device is increased.

This result is achieved maintaining a level of reliability equal (if not higher) to the one of corresponding standard memory devices. In other words, the error detection structure of the described embodiment of the invention avoids wasting resources (in terms of space and speed) for achieving performances that are useless in the most practical applications.

The embodiment of the invention described above offers further advantages.

Particularly, the error detection structure only acts on the transitions corresponding to the first two levels and to the last two levels supported by the memory cells.

This choice ensures the best results of the proposed solution.

Without detracting from the general applicability of the embodiment of the invention, only the errors in one (or more) of the least significant bits stored in each memory cell are corrected.

The exploited algorithm is particularly simple, but at the same time effective.

As a further improvement, the error detection structure can be disabled selectively.

This allows achieving a complete programmability at the bit level (with a substantially negligible reduction of the reliability).

However, the solution according to the described embodiment of the present invention is suitable to be implemented also acting on a different number of ending levels supported by the memory cells, or using logic values expressed with a base different from 2; alternatively, errors in different bits are corrected, or no possibility is provided for disabling the error detection structure.

In one embodiment of the present invention, the words are alternately distributed on the least significant bits and on the most significant bits of the values stored in the various memory cells.

This mode of distribution of the bits allows the programmability at the word level, and partially also at the bit level. Furthermore, the words associated with the most significant bits are immediately accessible (without any delay); in the case of reading operations in burst mode, this allows avoiding any waiting time.

Advantageously, the words associated with the least significant bits are corrected independently.

The proposed characteristic allows exploiting the benefits of the described embodiment of the present invention at its best.

As a further enhancement, the error detection structure can be disabled individually for each word associated with the least significant bits.

This allows minimizing the loss of reliability caused by the complete programmability at the bit level.

However, the solution of the described embodiment of the present invention is also suitable to be used with a different distribution of the words, correcting all the words of the page associated with the least significant bits at the same time, or only with the possibility of completely disabling the error detection structure in response to the change of a bit.

The proposed error detection structure is used in a multilevel memory device; the multilevel memory device may allow programming each memory cell individually (even if different applications are not excluded).

Naturally, in order to satisfy local and specific requirements, a person skilled in the art may apply to the solution described above many modifications and alterations all of which, however, are included within the scope of protection of the invention as defined by the following claims.

The invention claimed is:

1. An error detection structure for a multilevel memory device including a plurality of memory cells, each memory cell being programmable at more than two levels and,
   wherein the levels have an associated sequence, each level in the sequence corresponding to a respective threshold voltage of the memory cell and each level representing a logic value consisting of a plurality of bits,
   wherein the sequence of levels includes a lower range consisting of the first two or more levels in the sequence and an upper range consisting of the last two or more levels in the sequence,
   wherein the structure further includes means for partitioning the bits of the levels in the lower range and the bits in the upper range into two subsets,
      a first most significant bit subset consisting of bits having the same value for all levels in the lower range and consisting of bits having the same value for all levels in the upper range,
      a second least significant bit subset consisting of the remaining bits having different values for levels in the lower range and consisting of bits having different values for levels in the upper range, and
   wherein the structure includes means for detecting errors in the values of a selected block of memory cells, and the means for detecting errors operating only on the bits of the second least significant bit subset of the block.

2. The structure according to claim 1, wherein the second least significant bit subset consists of at least one least significant bit of the logic value.

3. The structure according to claim 1, further including means for storing an indicator of change of at least one bit of the second least significant bit subset and means for selectively disabling the means for detecting errors according to the indicator of change.

4. The structure according to claim 1, wherein the bits of the block are organized into a plurality of words partitioned into a first and a second set, each word being suitable to be individually processed in the memory device, and wherein the structure further includes means for associating the words of the first set and the words of the second set with the bits of the first most significant bit subset and the bits of the second least significant bit subset of the block, respectively.

5. The structure according to claim 4, wherein the second set consists of a plurality of words, the means for detecting errors including a plurality of error detection units each one for detecting errors in a word corresponding to the second set.

6. The structure according to claim 5, further including, for each word of the second set, means for storing an indicator of change of at least one bit and means for selectively disabling the corresponding error detection unit according to the indicator of change.

7. A multilevel memory device including a plurality of memory cells and the error detection structure according to claim 1.

8. The multilevel memory device according to claim 7, further including means for individually programming each memory cell.

9. An error detection method for a multilevel memory device including a plurality of memory cells each one being programmable at more than two levels, the levels having an associated sequence, each level in the sequence representing a logic value consisting of a plurality of bits, the method including the steps of:
   detecting errors in the values of a selected block of memory cells comprising partitioning the bits of each memory cell of the block into a first subset and a second subset, the bits of the first subset being unchanged between the first two levels in the sequence and between the last two levels in the sequence, the step of detecting errors only operating on the bits of the second subset of the block.

* * * * *